United States Patent
Chang et al.

(10) Patent No.: US 11,923,449 B2
(45) Date of Patent: Mar. 5, 2024

(54) MANUFACTURING METHOD FOR SEMICONDUCTOR DEVICE

(71) Applicant: Winbond Electronics Corp., Taichung (TW)

(72) Inventors: Hao-Chuan Chang, Taichung (TW); Kai Jen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 109 days.

(21) Appl. No.: 17/739,210

(22) Filed: May 9, 2022

(65) Prior Publication Data

US 2022/0262943 A1   Aug. 18, 2022

Related U.S. Application Data

(62) Division of application No. 16/681,704, filed on Nov. 12, 2019, now Pat. No. 11,367,787.

(51) Int. Cl.
| | |
|---|---|
| *H01L 29/66* | (2006.01) |
| *H01L 21/285* | (2006.01) |
| *H01L 29/20* | (2006.01) |
| *H01L 29/205* | (2006.01) |
| *H01L 29/423* | (2006.01) |

(Continued)

(52) U.S. Cl.
CPC .... *H01L 29/7789* (2013.01); *H01L 21/28581* (2013.01); *H01L 29/2003* (2013.01); *H01L 29/205* (2013.01); *H01L 29/42316* (2013.01); *H01L 29/66462* (2013.01); *H01L 29/7786* (2013.01); *H10B 12/053* (2023.02); *H10B 12/34* (2023.02)

(58) Field of Classification Search
None
See application file for complete search history.

(56) References Cited

U.S. PATENT DOCUMENTS

| 7,098,093 B2 | 8/2006 | Clarke et al. |
| 2005/0145883 A1 | 7/2005 | Beach et al. |

(Continued)

FOREIGN PATENT DOCUMENTS

| TW | 201814793 | 4/2018 |
| TW | 201838175 | 10/2018 |

(Continued)

OTHER PUBLICATIONS

"Office Action of China Counterpart Application", dated Apr. 18, 2023, p. 1-p. 9.

*Primary Examiner* — Bilkis Jahan
(74) *Attorney, Agent, or Firm* — JCIPRNET

(57) ABSTRACT

A manufacturing method for a semiconductor device is provided. The method includes: forming a recess at a top surface of a substrate; forming a channel layer and a barrier layer in order, to conformally cover surfaces of the recess; filling up the recess with a conductive material; removing a top portion of the conductive material, such that a lower portion of the conductive material remained in the recess forms a gate electrode; and forming an insulating structure on the gate electrode. A hetero junction formed at an interface of the channel layer and the barrier layer is external to the substrate, and a two dimensional electron gas or a two dimensional hole gas is induced along the hetero junction external to the substrate.

20 Claims, 15 Drawing Sheets

(51) Int. Cl.
*H01L 29/778* (2006.01)
*H10B 12/00* (2023.01)

(56) References Cited

U.S. PATENT DOCUMENTS

| | | |
|---|---|---|
| 2010/0078698 A1 | 4/2010 | Son et al. |
| 2011/0312138 A1 | 12/2011 | Yedinak et al. |
| 2012/0305987 A1 | 12/2012 | Hirler et al. |
| 2014/0367774 A1* | 12/2014 | Yoo .................... H01L 29/4236 |
| | | 257/330 |
| 2015/0214314 A1 | 7/2015 | Oh |
| 2016/0172488 A1* | 6/2016 | Oh ...................... H10B 12/315 |
| | | 257/330 |
| 2016/0315088 A1* | 10/2016 | Kang ................... H01L 29/513 |
| 2017/0345921 A1* | 11/2017 | Feng ................... H01L 29/4236 |
| 2018/0174845 A1 | 6/2018 | Jang et al. |
| 2018/0294335 A1* | 10/2018 | Luo .................... H01L 29/1054 |
| 2019/0081164 A1 | 3/2019 | Shrivastava |
| 2019/0198615 A1* | 6/2019 | Mishra ............... H01L 29/2003 |
| 2020/0220001 A1* | 7/2020 | Shimizu .............. H01L 29/045 |

FOREIGN PATENT DOCUMENTS

| | | |
|---|---|---|
| TW | 201904027 | 1/2019 |
| TW | 201905979 | 2/2019 |

\* cited by examiner

MANUFACTURING METHOD FOR SEMICONDUCTOR DEVICE

CROSS-REFERENCE TO RELATED APPLICATION

This application is a divisional application of and claims the priority benefit of U.S. patent application Ser. No. 16/681,704, filed on Nov. 12, 2019, now allowed. The entirety of the above-mentioned patent application is hereby incorporated by reference herein and made a part of this specification.

BACKGROUND

Technical Field

The present disclosure is related to a manufacturing method for semiconductor device, and particularly, to manufacturing method for an embedded transistor device.

Description of Related Art

In recent decades, dynamic random access memory (DRAM) with embedded word lines has been developed for promising lower parasitic capacitance between word lines and bit lines, as well as improving integration level of the DRAM. A conductive channel of a transistor in the DRAM with embedded word lines is typically formed in a region of a substrate close to a sidewall of a recess. In certain cases, charges in the conductive channel may move upwardly to a top surface of the substrate, or laterally move to adjacent memory cell. In either way, reliability of the transistor or the DRAM would be negatively affected.

SUMMARY

Accordingly, a manufacturing method of a semiconductor device with improved reliability is provided.

In an aspect of the present disclosure, a manufacturing method of a semiconductor device is provided. The manufacturing method includes: forming a recess at a top surface of a substrate; forming a channel layer and a barrier layer in order, to conformally cover surfaces of the recess, wherein a hetero junction formed at an interface of the channel layer and the barrier layer is external to the substrate, and a two dimensional electron gas or a two dimensional hole gas is induced along the hetero junction external to the substrate; filling up the recess with a conductive material; removing a top portion of the conductive material, such that a lower portion of the conductive material remained in the recess forms a gate electrode; and forming an insulating structure on the gate electrode.

In another aspect of the present disclosure, a manufacturing method of a semiconductor device is provided. The manufacturing method includes: forming a recess at a top surface of a substrate; forming a first channel layer and a first barrier layer in order, to conformally cover surfaces of the recess; forming a first dummy structure and a second dummy structure in the recess, wherein the first and second dummy structures are in lateral contact with vertically extending portions of the first barrier layer, and are laterally spaced apart from each other; forming a mask structure between the first and second dummy structures; removing the first and second dummy structures to form first and second gaps between the mask structure and the vertically extending portions of the first barrier layer; forming a first gate electrode and a second gate electrode in the first and second gaps, respectively; removing the mask structure; and filling an insulating structure in the recess.

As above, the semiconductor device according to embodiments of the present disclosure is an embedded type semiconductor device. A conductive channel of the semiconductor device is formed in the hetero junction formed by the channel layer and the barrier layer inside the recess of the substrate, rather than being formed in a portion of the substrate close to the recess of the substrate. In this way, charges in the conductive channel can be avoided from moving to the drain electrode or the source electrode on the substrate through a path in the substrate, thus formation of sneak current can be avoided. Therefore, reliability of the semiconductor device can be improved. In addition, charges can be avoided from moving between the semiconductor device and adjacent devices along paths in the substrate. As such, interference between the semiconductor device and other devices can be reduced. In some embodiments, the semiconductor device includes the hard mask pattern. The hard mask pattern is disposed between the drain electrode and the substrate, and between the source electrode and the substrate. Charges can be further blocked by the hard mask pattern from moving to the drain electrode and the source electrode from the substrate.

DESCRIPTION OF THE EMBODIMENTS

Figure 1:
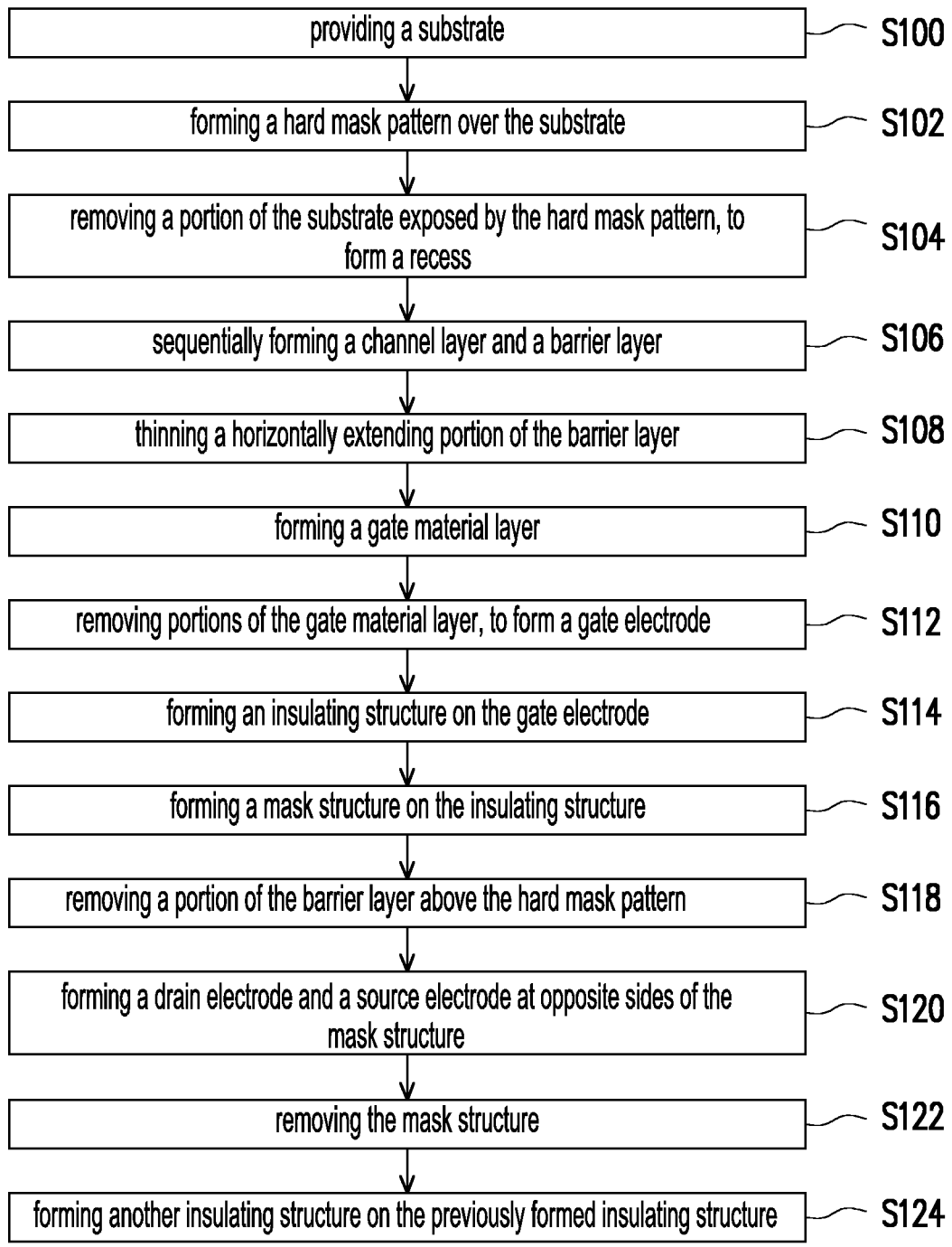
FIG. 1 is a flow diagram illustrating a manufacturing method of a semiconductor device according to some embodiments of the present disclosure.
Figure 2A:
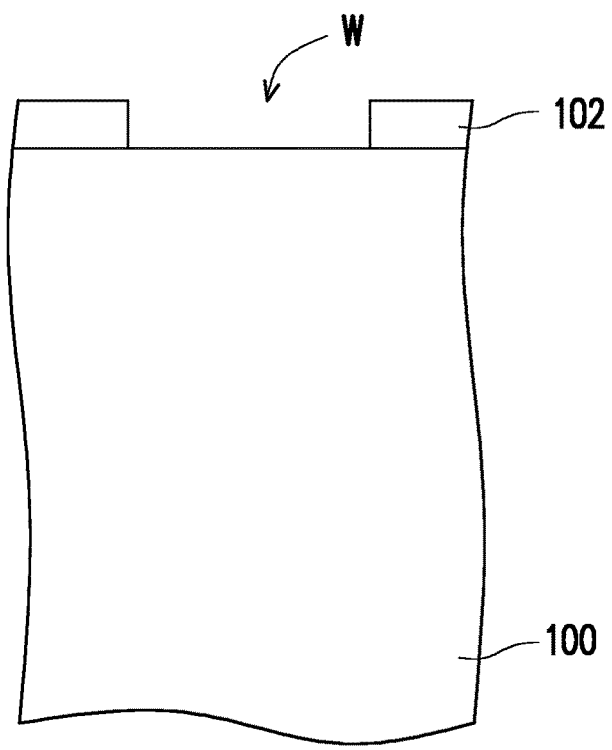
FIG. 2A through FIG. 2L are schematic cross-sectional views illustrating structures at various stages during the manufacturing process of the semiconductor device as shown in FIG. 1.

Referring to FIG. 1 and FIG. 2A, step S100 is performed, and a substrate 100 is provided. For instance, the substrate 100 is a semiconductor substrate.

Figure 2B:
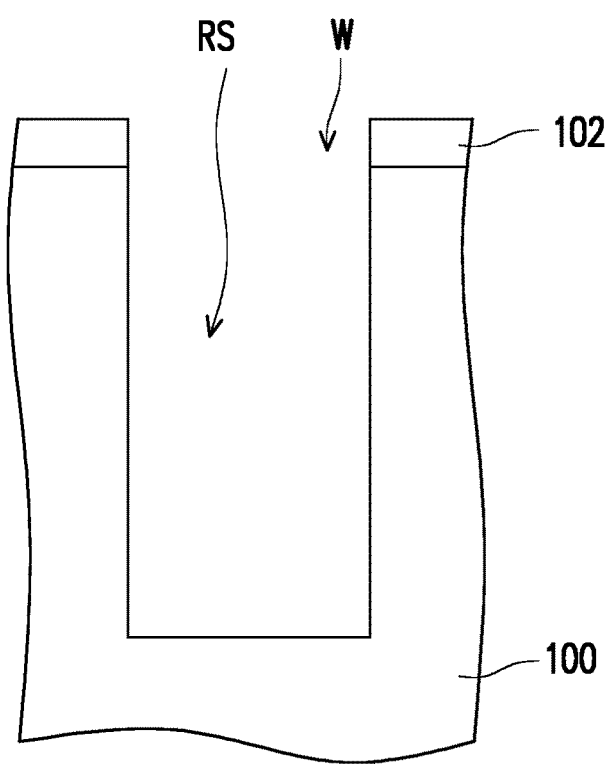

Step S102 is performed, and a hard mask pattern 102 is formed over the substrate 100. The hard mask pattern 102 has an opening W. Although only a single opening W is depicted in FIG. 2A, the hard mask pattern 102 may actually have more than one openings W. The opening W is formed for defining location, dimension and shape of a recess RS to be formed in the subsequent step (as shown in FIG. 2B). The opening W may be formed in a stripe shape, such that the subsequently formed recess RS could be a trench in a stripe shape.

Referring to FIG. 2B, step S104 is performed, and a portion of the substrate 100 exposed by the hard mask pattern 102 is removed, so as to form the recess RS. In some embodiments, an etching process (e.g., an anisotropic etching process) for forming the recess RS is performed by using the hard mask pattern 102 as a shadow mask. In this way, a sidewall of the recess RS may be substantially coplanar with a sidewall of the opening W of the hard mask pattern 102.

Figure 2C:
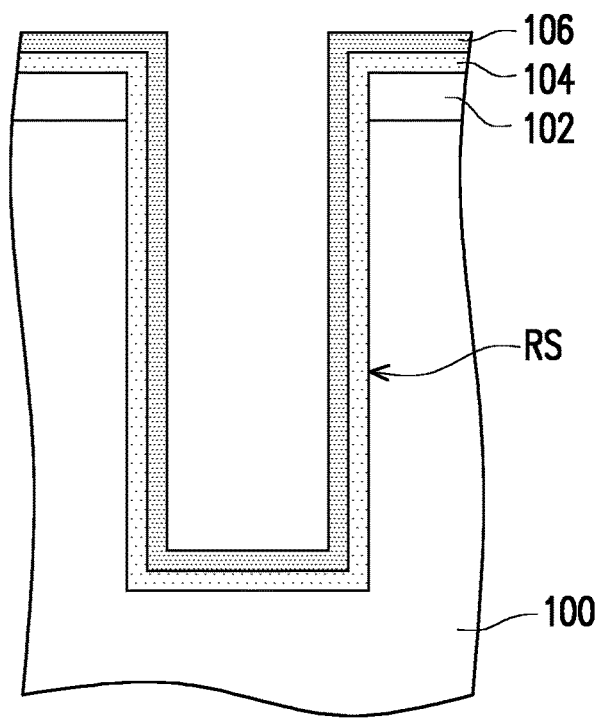

Referring to FIG. 2C, step S106 is performed, and a channel layer 104 and a barrier layer 106 are sequentially formed. A top surface of the hard mask pattern 102, a sidewall of the hard mask pattern 102 and a surface of the recess RS of the substrate 100 are covered by the channel layer 104, and a surface of the channel layer 104 is covered by the barrier layer 106. In some embodiments, a method for forming the channel layer 104 and a method for forming the barrier layer 106 may respectively include an epitaxial process. Materials of the channel layer 104 and the barrier layer 106 may respectively include a group III nitride or a group III-V compound semiconductor material. For instance, the material of the channel layer 104 may include GaN, GaAs, the like or combinations thereof, whereas the material of the barrier layer 106 may include InAlGaN, AlGaN, AlInN, AN, the like or combinations thereof. A hetero junction formed by the channel layer 104 and the barrier layer 106 may induce a spontaneous polarization effect and a piezoelectric polarization effect, and two dimensional electron gas (2DEG) or two dimensional hole gas (2DHG) may be generated in the vicinity of an interface between the channel layer 104 and the barrier layer 106. As such, the hetero junction formed by the channel layer 104 and the barrier layer 106 may be functioned as an active region of a high electron mobility transistor (HEMT) or a high hole mobility transistor (HHMT). In some embodiments, a thickness of the channel layer 104 and a thickness of the barrier layer 106 may respectively range from 3 nm to 50 nm. In these embodiments, the thickness of the barrier layer 106 is large enough for forming continuously extending 2DEG or 2DHG in the vicinity of the interface between the channel layer 104 and the barrier layer 106.

Figure 2D:
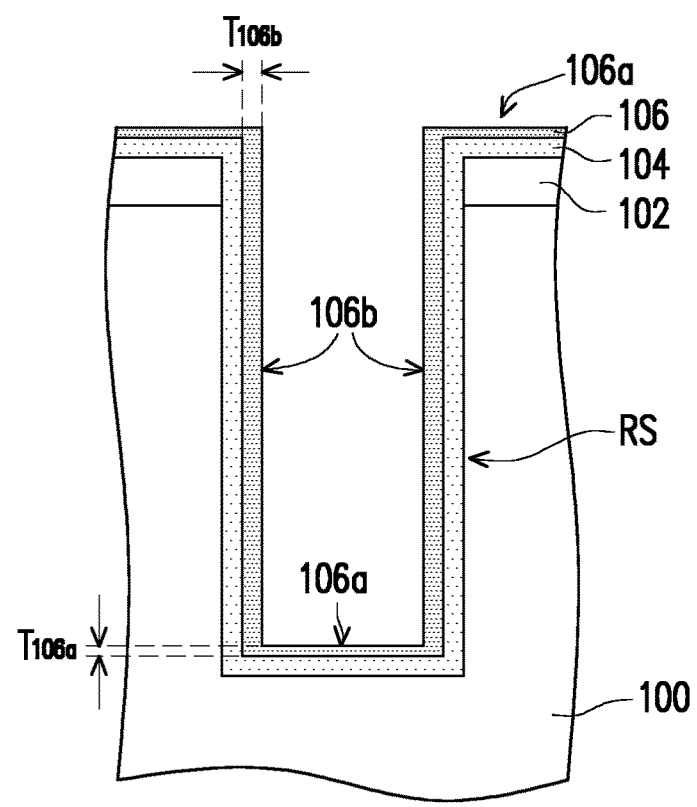

Referring to FIG. 2D, step S108 is performed, and a horizontally extending portion 106a of the barrier layer 106 are thinned. The barrier layer 106 has a horizontally extending portions 106a and a vertically extending portions 106b. The top surface of the hard mask pattern 102 and a bottom surface of the recess RS are covered by the horizontally extending portion 106a, whereas the sidewall of the hard mask pattern 102 and the sidewall of the recess RS are covered by the vertically extending portion 106b. In some embodiments, a skin part of the horizontally extending portion 106a may be removed by an anisotropic etching process, such that the horizontally extending portion 106a could be thinned. On the other hand, the vertically extending portion 106b of the barrier layer 106 is not subjected to the thinning process, and the thickness of the barrier layer 106b may remain unchanged. In this way, the thickness of the horizontally extending portion 106a has become less than the thickness of the vertically extending portion 106b. For instance, the current thickness $T_{106a}$ of the horizontally extending portion 106a may range from 2 nm to 49 nm, whereas the thickness $T_{106b}$ of the vertically extending portion 106b may range from 3 nm to 50 nm. When the thickness $T_{106a}$ of the vertically extending portion 106a of the barrier layer 106 has become less than the thickness of the channel layer 104, portions of the 2DEG or 2DHG formed in the vicinity of the interface between the horizontally extending portion 106a and the channel layer 104 no longer exist. On the other hand, since the vertically extending portion 106b of the barrier layer 106 is not subjected to the thinning process, portions of the 2DEG or 2DHG in the vicinity of the interface between the vertically extending portion 106b and the channel layer 104 would remain. Accordingly, when the hetero junction formed by the barrier layer 104 and the channel layer 104 is unbiased, the 2DEG or 2DHG is continuous along a vertical direction, but discontinuous along a horizontal direction. Therefore, the hetero junction made by the barrier layer 106 and the channel layer 104 can be functioned as an active region of an enhance mode HEMT/HHMT (or referred as a normally-off HEMT/HHMT).

Figure 2E:
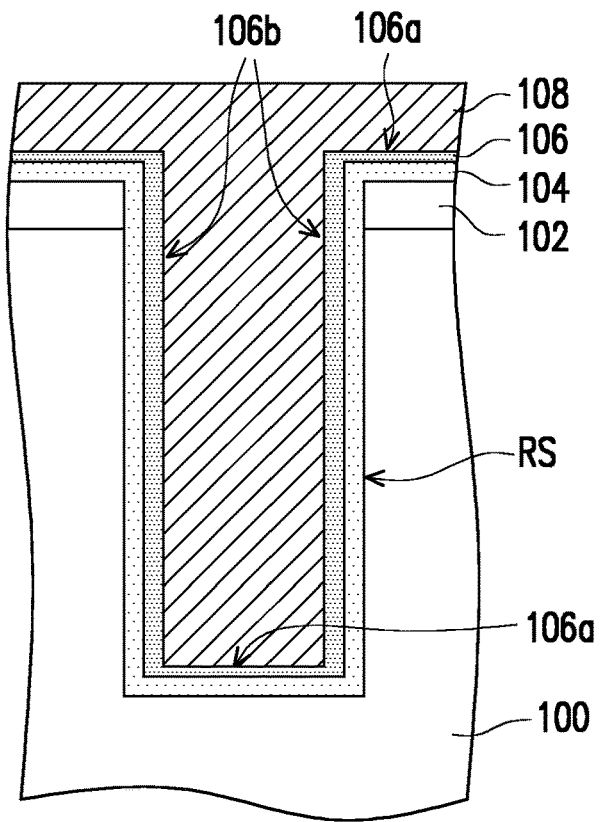

Referring to FIG. 2E, step S110 is performed, and a gate material layer 108 is formed. The structure as shown in FIG. 2D may be globally covered by the gate material layer 108, and the gate material layer 108 may extend into the recess RS. Accordingly, the horizontally extending portion 106a and the vertically extending portion 106b of the barrier layer 106 are both covered by the gate material layer 108. In some embodiments, the recess RS is filled up by the gate material layer 108. A material of the gate material layer 108 may include a metal, a metal nitride, a metal silicide or other materials that could form schottky contact with the barrier layer 106. A method for forming the gate material layer 108 may include a chemical vapor deposition (CVD) process, a physical vapor deposition process (PVD), the like or combinations thereof.

Figure 2F:
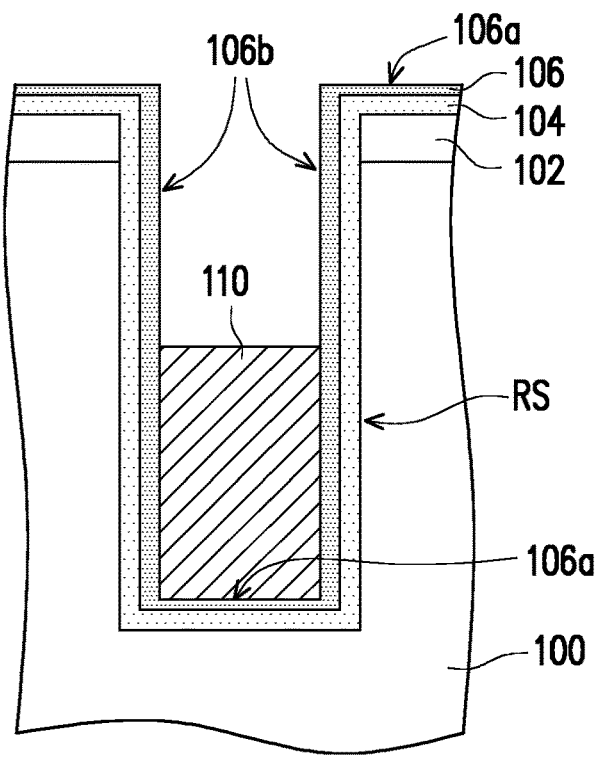

Referring to FIG. 2F, step S112 is performed, and some portions of the gate material layer 108 are removed, to form a gate electrode 110. In some embodiments, a portion of the gate material layer 108 above a topmost surface of the substrate 100 and another portion of the gate material layer 108 located in an upper part of the recess RS are removed, and the remained portion of the gate material layer 108 forms the gate electrode 110. In these embodiments, a top surface of the gate electrode 110 may be lower than the topmost surface of the substrate 100. A method for removing the portions of the gate material layer 108 may include an etching process, a chemical mechanical polishing (CMP) process or a combination thereof.

Figure 2G:
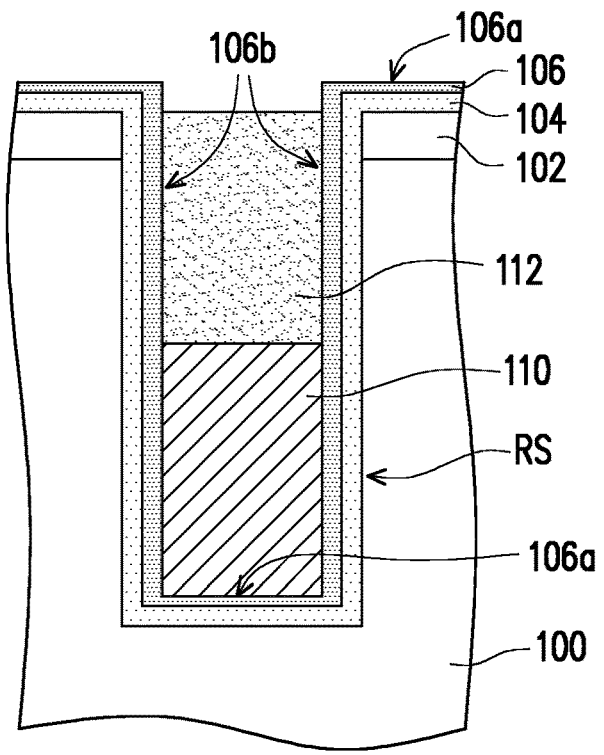

Referring to FIG. 2G, step S114 is performed, and an insulating structure 112 is formed on the gate electrode 110. In some embodiments, a method for forming the insulating structure 112 includes forming an insulating material layer (not shown) over the structure shown in FIG. 2F by a CVD process, and removing some portions of the insulating material layer to form the insulating structure 112. The insulating structure 112 extends upwardly from the gate electrode 110, and a top surface of the insulating structure 112 is lower than a topmost surface of the barrier layer 106. In some embodiments, the top surface of the insulating structure 112 is higher than the topmost surface of the substrate 100, and may be lower than, coplanar with or higher than the top surface of the hard mask pattern 102. For instance, a height difference between the top surface of the insulating structure 112 and the topmost surface of the barrier layer 106 may range from 30 nm to 60 nm. In addition, a material of the insulating structure 112 may include silicon oxide, silicon nitride or a combination thereof.

Figure 2H:
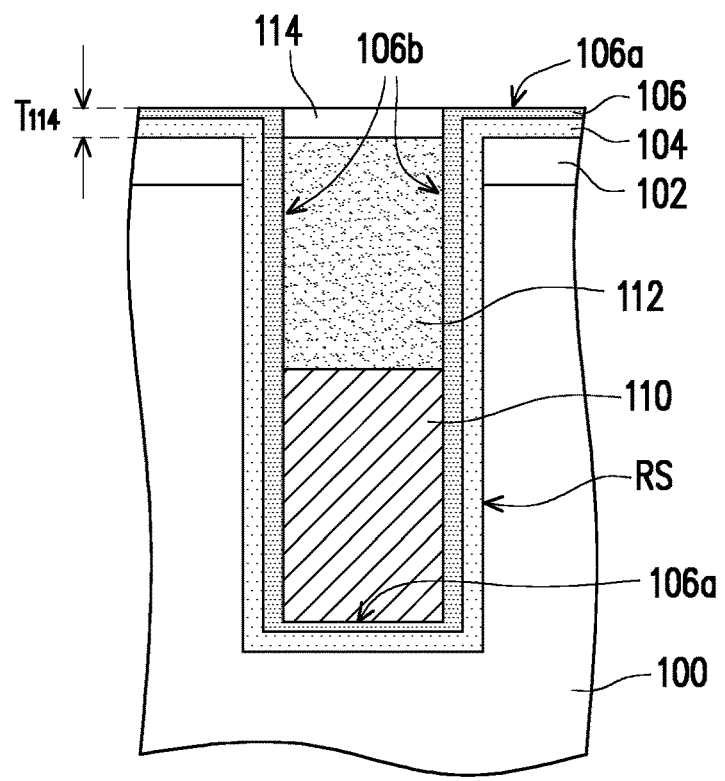

Referring to FIG. 2H, step S116 is performed, and a mask structure 114 is formed on the insulating structure 112. In some embodiments, a top surface of the mask structure 114 may be substantially coplanar with the topmost surface of the barrier layer 106. For instance, a thickness $T_{114}$ of the mask structure 114 may range from 30 nm to 60 nm. In addition, a material of the mask structure 114 has sufficient etching selectivity with respect to the material of the insulating structure 112. In some embodiments, the material of the insulating structure 112 includes silicon nitride, whereas the mask structure 114 includes silicon oxide.

Figure 2I:
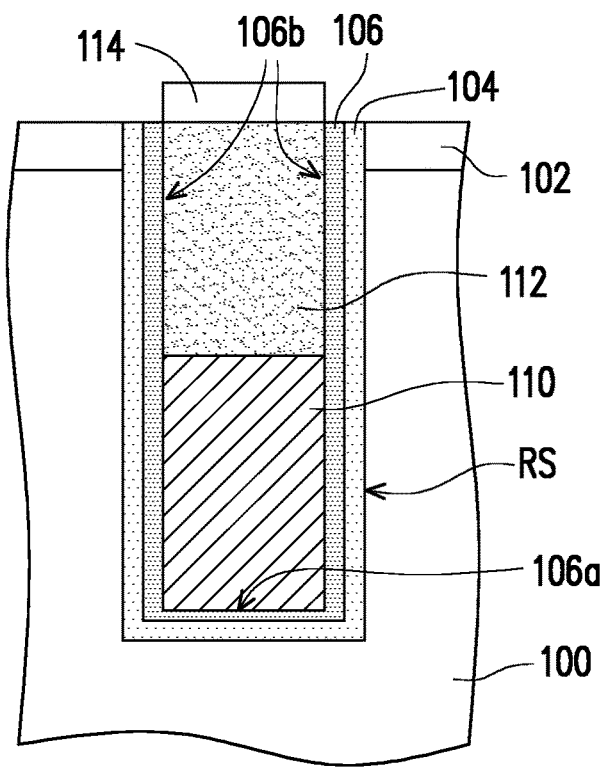

Referring to FIG. 2I, step S118 is performed, and a portion of the barrier layer 106 above the hard mask pattern 102 is removed. In some embodiments, the barrier layer 106 may be etched by using the mask structure 114 as a shadow mask. In addition, the hard mask pattern 102 may be functioned as an etching stop layer during the etching process performed on the barrier layer 106, such that the portion of the barrier layer 106 above the hard mask pattern 102 can be removed. Currently, top surfaces of the hard mask pattern 102, the channel layer 104 and the barrier layer 106 may be substantially coplanar with one another.

Figure 2J:
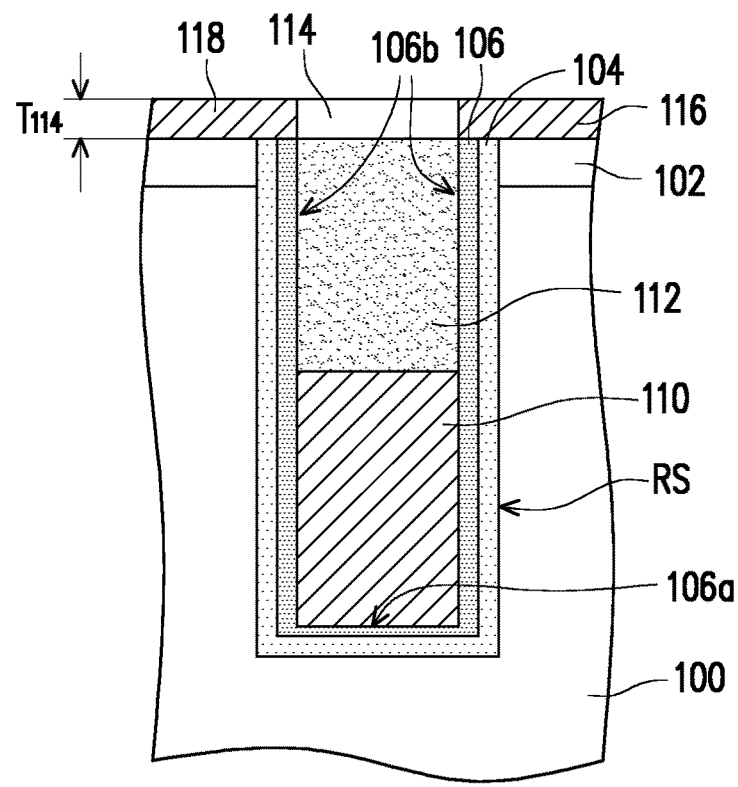

Referring to FIG. 2J, step S120 is performed, and a drain electrode 116 and a source electrode 118 are formed at opposite sides of the mask structure 114. In some embodiments, a method for forming the drain electrode 116 and the source electrode 118 includes forming a conductive material layer (not shown) on the structure shown in FIG. 2I. The top surface of the hard mask pattern 102, the top surface of the channel layer 104, the top surface of the barrier layer 106 and the top surface of the mask structure 114 are covered by this conductive material layer. Subsequently, a planarization process (such as a CMP process) is performed on the conductive material layer, and the mask structure 114 may be functioned as a stop layer during the planarization process. Thereafter, the planarized conductive material layer may be patterned to form the drain electrode 116 and the source electrode 118. The drain electrode 116 and the source electrode 118 are separated from each other, and cover portions of the barrier layer 106, the channel layer 104 and the hard mask pattern 102 located at opposite sides of the mask structure 114. In some embodiments, a material of the drain electrode 116 and the source electrode 118 includes a metal or any material that could form ohmic contact with the barrier layer 106. A thickness of the drain electrode 116 and the source electrode 118 may be substantially equal to the thickness $T_{114}$ of the mask structure 114, and may range from, for example, 30 nm to 60 nm.

Figure 2K:
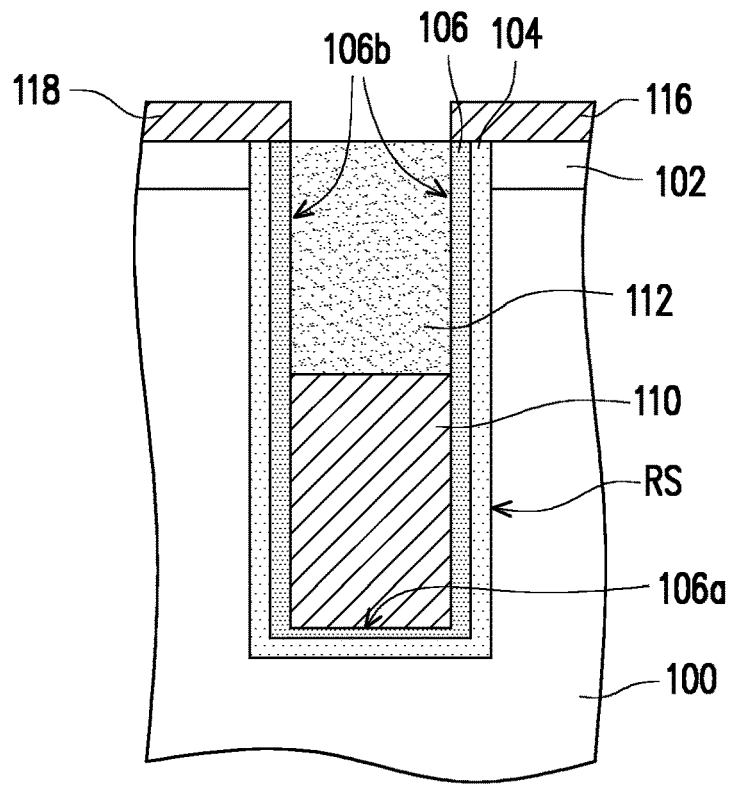

Referring to FIG. 2K, step S122 is performed, and the mask structure 114 is removed. In some embodiments, the mask structure 114 may be removed by an etching process (e.g., an isotropic etching process or an anisotropic etching process). Since the material of the mask structure 114 may have sufficient etching selectivity with respect to the material of the insulating structure 112, the insulating structure 112 may be functioned as an etching stop layer during the etching process performed on the mask structure 114. Once the mask structure 114 has been removed, the top surface of the insulating structure 112 and opposing sidewalls of the drain electrode 116 and the source electrode 118 may be exposed.

Figure 2L:
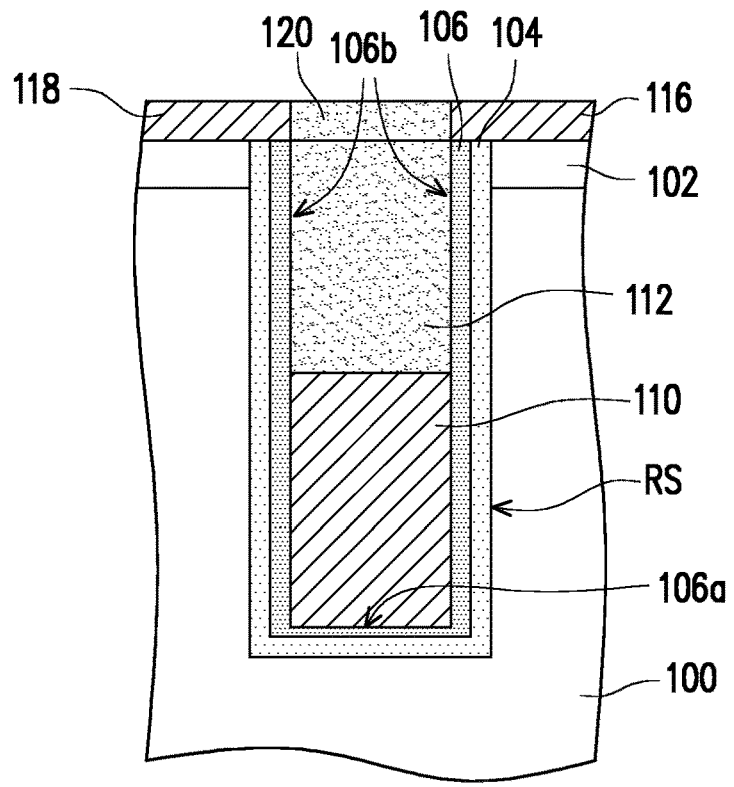

Referring to FIG. 2L, step S124 is performed, and another insulating structure 120 is formed over the insulating structure 112. A top surface of the insulating structure 120 may be substantially coplanar with top surfaces of the drain electrode 116 and the source electrode 118. A material of the insulating structure 120 may include silicon oxide, silicon nitride, the like or combinations thereof.

Up to here, manufacturing of a semiconductor device 10 according to some embodiments of the present disclosure may have been completed. The semiconductor device 10 may be an embedded type HEMT/HHMT, and is at least partially formed in the recess of the substrate 100. When the gate electrode 110 does not receive a gate voltage or the gate voltage received by the gate electrode 110 is less than a threshold value, the 2DEG or 2DHG in the hetero junction formed by the channel layer 104 and the barrier layer 106 is discontinuous, such that the semiconductor device 10 is in an off state. On the other hand, when the gate voltage received by the gate electrode 110 is greater than the threshold value, the 2DEG or 2DHG in the hetero junction formed by the channel layer 104 and the barrier layer 106 becomes continuous, and the semiconductor device 10 turns into an on state. Moreover, in some embodiments, the semiconductor device 10 may be a portion of a unit cell in a DRAM integrated circuit, and a capacitor structure (not shown) may be further formed on the drain electrode 116 or the source electrode 118 of the semiconductor device 10.

In summary, a conductive channel of the semiconductor device 10 (i.e., the 2DEG/2DHG as described above) is formed inside the recess RS of the substrate 100, rather than being formed in a portion of the substrate 100 close to the recess RS of the substrate 100. In this way, charges in the conductive channel can be avoided from moving to the drain electrode 116 or the source electrode 118 through a path in the substrate 100, thus formation of sneak current can be avoided. Therefore, reliability of the semiconductor device 10 can be improved. In addition, charges can be avoided from moving between the semiconductor device 10 and adjacent devices along paths in the substrate 100. As such, interference between the semiconductor device 10 and other devices can be reduced. In some embodiments, the semiconductor device 10 includes the hard mask pattern 102. The hard mask pattern 102 is disposed between the drain electrode 116 and the substrate 100, and between the source electrode 118 and the substrate. Charges can be further blocked by the hard mask pattern 102 from moving to the drain electrode 116 and the source electrode 118 from the substrate 100.

Figure 3:
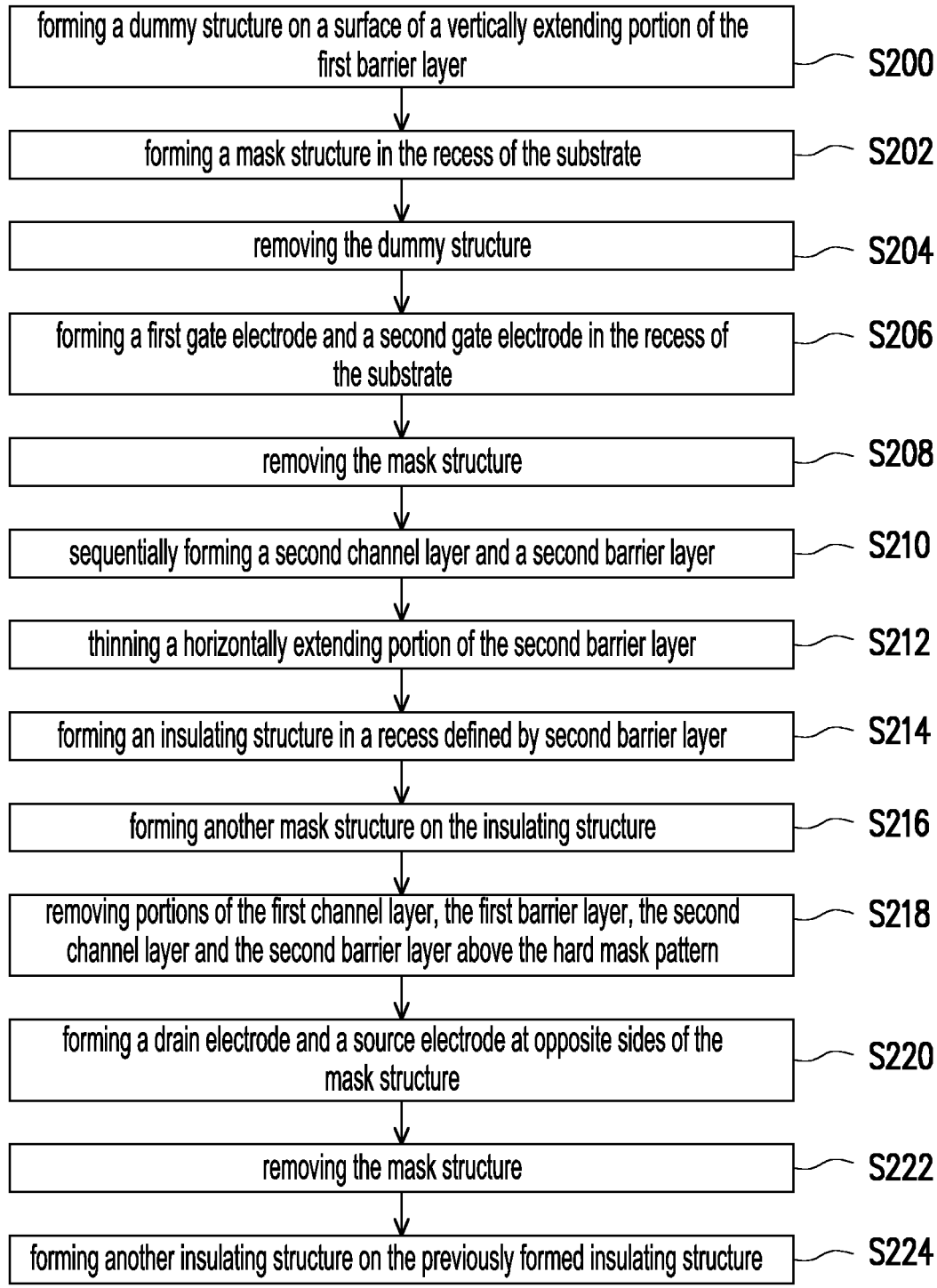
FIG. 3 is a flow diagram illustrating a manufacturing method of a semiconductor device according to some embodiments of the present disclosure.
Figure 4A:
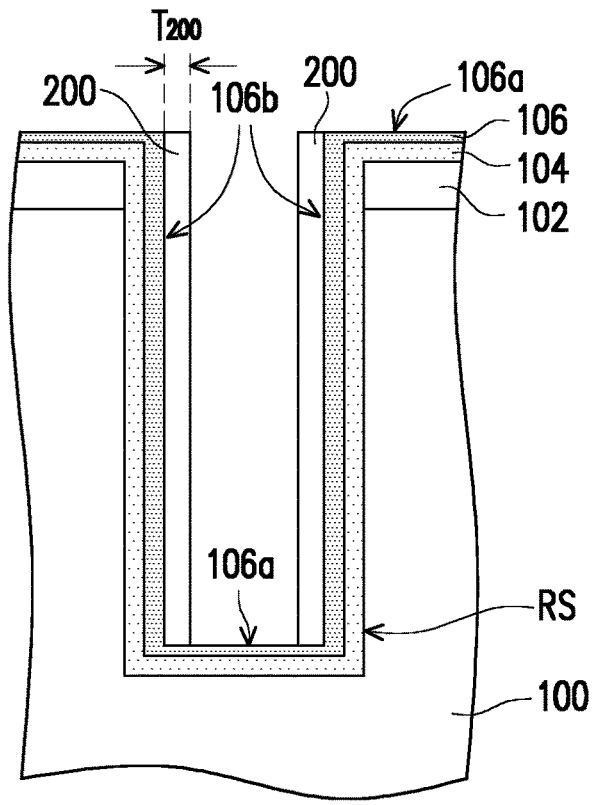
FIG. 4A through FIG. 4K are schematic cross-sectional views illustrating structures at various stages during the manufacturing process of the semiconductor device as shown in FIG. 3.

Referring to FIG. 3 and FIG. 4A, in some embodiments, step S200 is performed after the step S100 through step S108 (as shown in FIG. 2A through FIG. 2D), and a dummy structure 200 is formed on a surface of the vertically extending portion 106b of the barrier layer 106. For instance, a method for forming the dummy structure 200 may include forming a dummy material layer (not shown) globally covering the barrier layer 106, then performing an anisotropic etching process to remove a horizontally extending portion of the dummy material layer. In this way, a portion of the dummy material layer covering the horizontally extending portion 106a of the barrier layer 106 is removed, whereas a portion of the dummy material layer covering the vertically extending portion 106b of the barrier layer 106 remains and forms the dummy structure 200. In some embodiments, a top surface of the dummy structure 200 is substantially coplanar with the topmost surface of the barrier layer 106. A material of the dummy structure 200 may include silicon oxide, silicon nitride, the like or combinations thereof. In addition, a thickness $T_{200}$ of the dummy structure 200 may range from 3 nm to 50 nm.

Figure 4B:
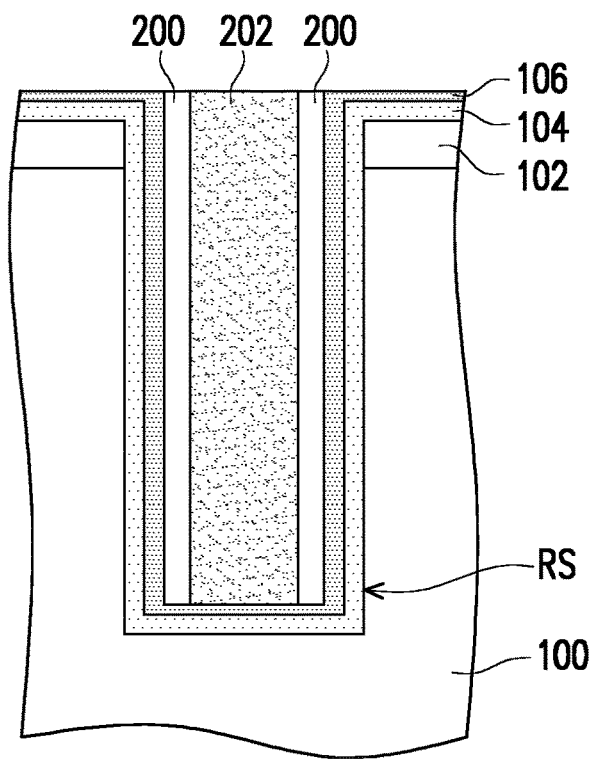

Referring to FIG. 4B, step S202 is performed, and a mask structure 202 is formed in the recess RS of the substrate 100. In some embodiments, a top surface of the mask structure 202 may be substantially coplanar with the topmost surfaces of the dummy structure 200 and the barrier layer 106. A material of the mask structure 202 has a sufficient etching selectivity with respect to the material of the dummy structure 200. For instance, the material of the mask structure 202 may include silicon nitride, whereas the material of the dummy structure 200 may include silicon oxide.

Figure 4C:
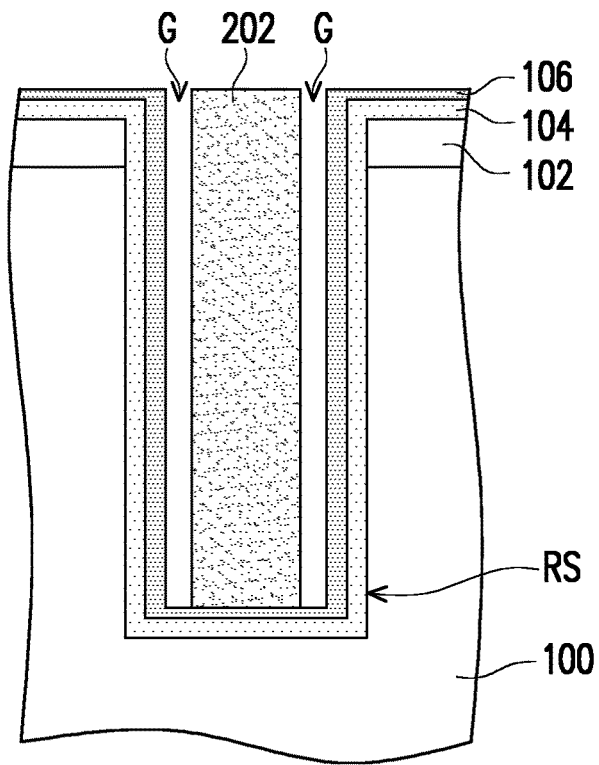

Referring to FIG. 4C, step S204 is performed, and the dummy structure 200 is removed. In some embodiments, the dummy structure 200 may be removed by an isotropic etching process or an anisotropic etching process. Once the dummy structure 200 has been removed, a gap G may be formed between the mask structure 202 and the barrier layer 106. In some embodiments, the gap G forms a circle in the recess RS, and may surround the mask structure 202.

Figure 4D:
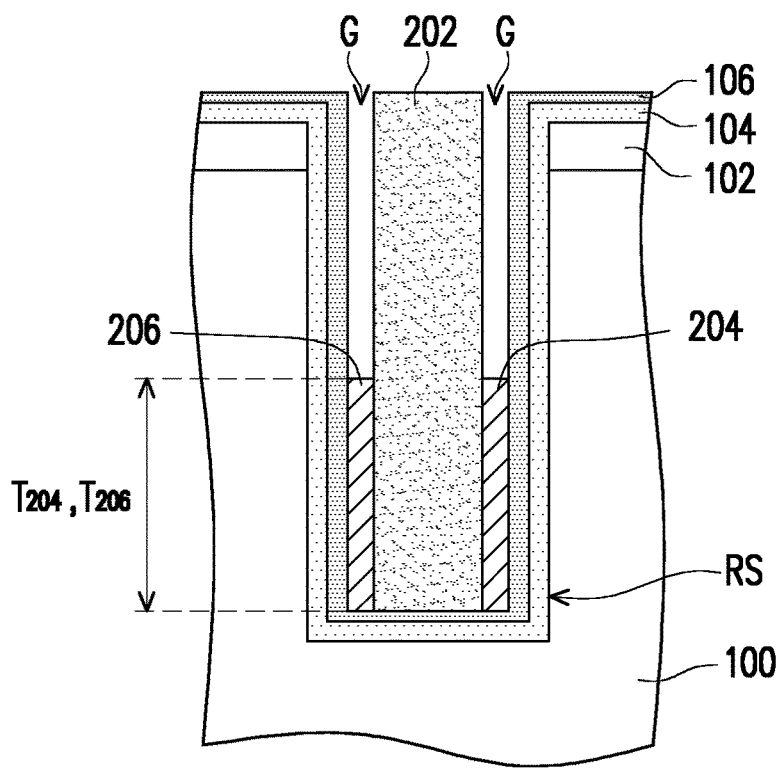

Referring to FIG. 4D, step S206 is performed, and a first gate electrode 204 and a second gate electrode 206 separated from each other are formed in the recess RS. A method for forming the first gate electrode 204 and the second gate electrode 206 may include forming a gate material layer on the structure as shown in FIG. 4C by a CVD process or a PVD process. The gate material layer covers the topmost surface of the barrier layer 106, and fills into the gap G. Thereafter, portions of the gate material layer located above the topmost surface of the barrier layer 106 and in an upper part of the gap G are removed, whereas a portion of the gate material layer located in a bottom part of the gap P is remained. Currently, the remained portion of the gate material layer forms a ring structure in the recess RS. Subsequently, a patterning process may be performed on the gate material layer, so as to form the separated first gate electrode 204 and second gate electrode 206 located on opposite sidewalls of the recess RS. The first gate electrode 204 and the second gate electrode 206 are separately located in the bottom portion of the gap G, and top surfaces of the first gate electrode 204 and the second gate electrode 206 are lower than the topmost surface of the substrate 100. In some embodiments, a thickness $T_{204}$ of the first gate electrode 204 and a thickness $T_{206}$ of the second gate electrode 206 are substantially equal to each other, and may respectively range from 3 nm to 50 nm. In addition, a material of the first gate electrode 204 and the second gate electrode 206 may be similar to the material of the gate electrode 110 as described with reference to FIG. 2F.

Figure 4E:
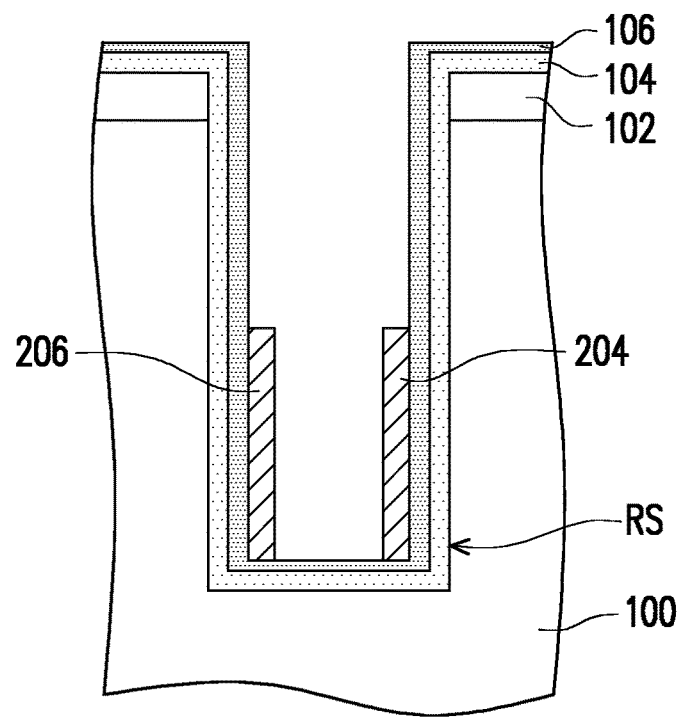

Referring to FIG. 4E, step S208 is performed, and the mask structure 202 is removed. For instance, the mask structure 202 may be removed by an isotropic etching process or an anisotropic etching process. Once the mask structure 202 has been removed, a bottom portion of the barrier layer 106 is exposed, along with the sidewalls of the first gate electrode 204 and the second gate electrode 206 that are facing away from the vertically extending portion 106b of the barrier layer 106.

Figure 4F:
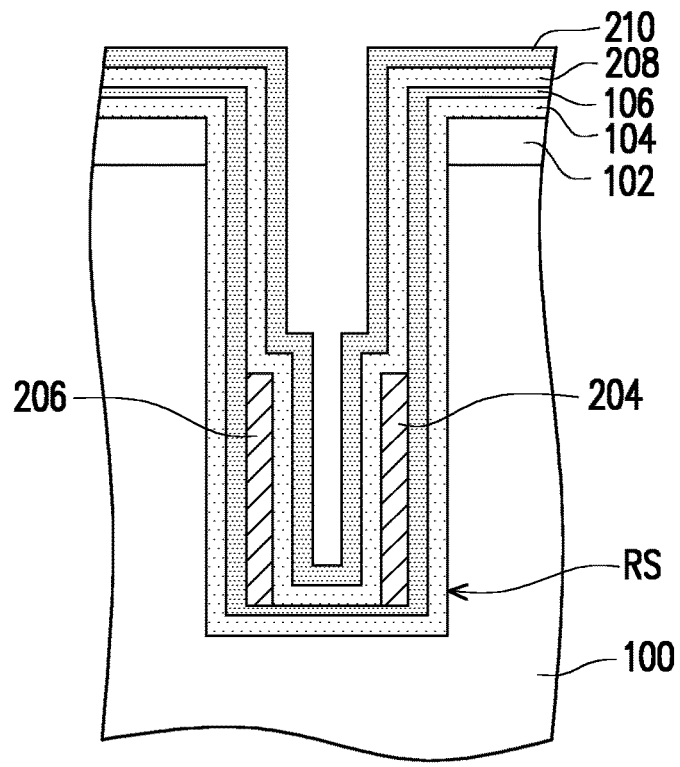

Referring to FIG. 4F, step S210 is performed, and a channel layer 208 and a barrier layer 210 are sequentially formed. The channel layer 208 and the barrier layer 210 may be referred as a second channel layer and a second barrier layer, whereas the previously formed channel layer 104 and the barrier layer 106 may be referred as a first channel layer and a first barrier layer. In some embodiments, the channel layer 208 and the barrier layer 210 are sequentially and conformally formed on the structure shown in FIG. 4E. In other words, exposed surfaces of the barrier layer 106, the first gate electrode 204 and the second gate electrode 206 are covered by the channel layer 208, and the channel layer 208 is covered by the barrier layer 210. Materials and formation methods of the channel layer 208 and the barrier layer 210 are similar to the materials and the formation methods of the channel layer 104 and the barrier layer 106. In addition, as the channel layer 104 and the barrier layer 106 forms a hetero junction, the channel layer 208 and the barrier layer 210 may form another hetero junction. As shown in FIG. 4F, the first gate electrode 204 is located between two hetero junctions. Similarly, the second gate electrode 206 is located between these two hetero junctions. Accordingly, both of the first gate electrode 204 and the second gate electrode 206 can be configured to receive gate voltages for controlling these two hetero junctions.

Figure 4G:
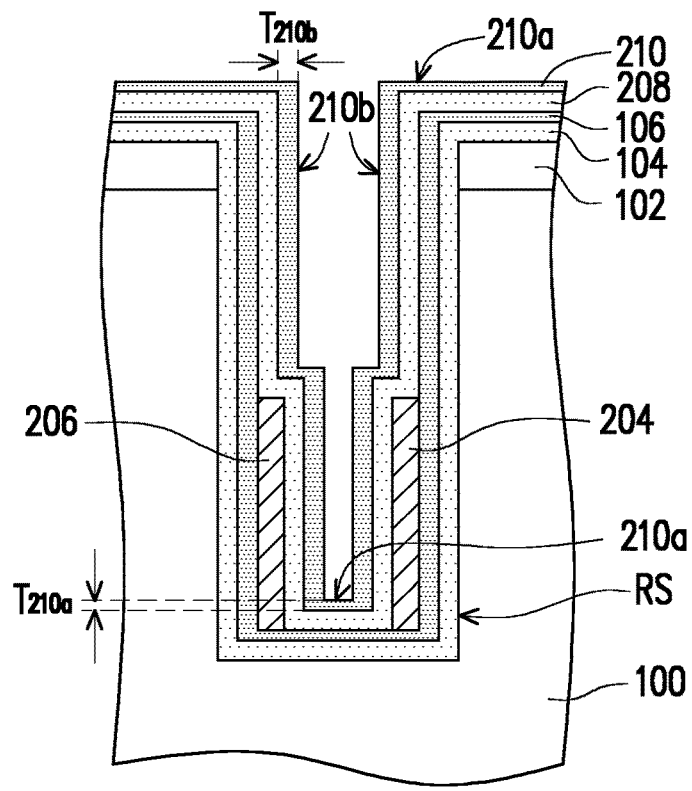

Referring to FIG. 4G, step S212 is performed, and a horizontally extending portion 210a of the barrier layer 210 is thinned. This step (i.e., the step S212) is similar to the step S108 as described with reference to FIG. 2D.

Figure 4H:
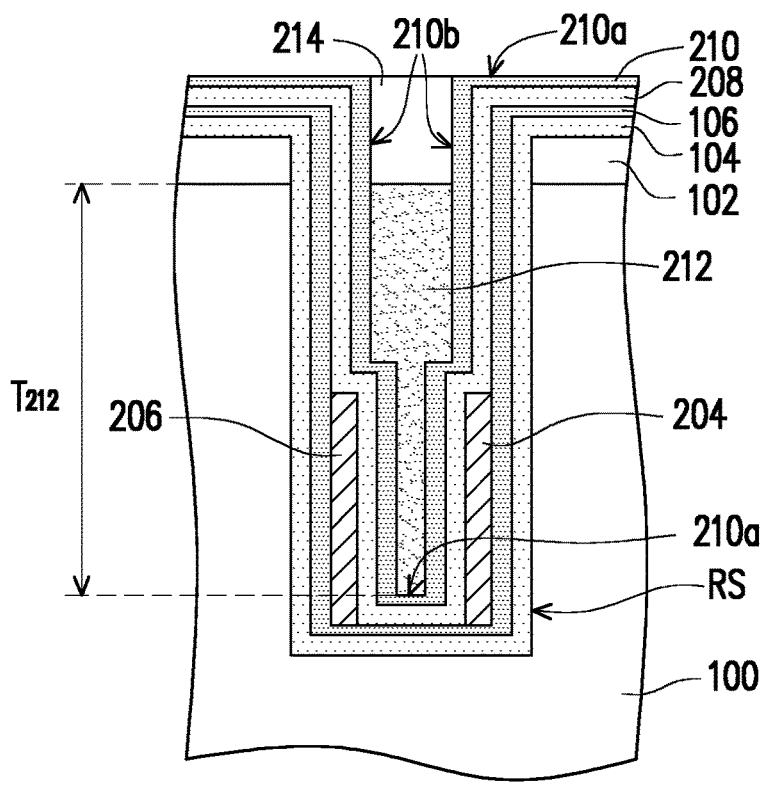

Referring to FIG. 4H, step S214 is performed, and an insulating structure 212 is formed. The insulating structure 212 fills in a recess defined by a bottom portion and a vertically extending portion 210b of the barrier layer 210. As shown in FIG. 4H, the insulating structure 212 has a bottom portion between the first gate electrode 204 and the second gate electrode 206, and has a top portion over the bottom portion. The bottom portion of the insulating structure 212 has a width less than a width of the top portion of the insulating structure 212. In some embodiments, a top surface of the insulating structure 212 is lower than a topmost surface of the barrier layer 210. In addition, the top surface of the insulating structure 212 may be higher than the topmost surface of the substrate 100, and may be lower than, coplanar with or higher than the top surface of the hard mask pattern 102. For instance, a thickness $T_{212}$ of the insulating structure 212 may range from 3 nm to 60 nm. In addition, a material and a formation method of the insulating structure 212 may be similar to the material and the formation method of the insulating structure 112 as described with reference to FIG. 2G, and would not be repeated again.

Thereafter, step S216 is performed, and a mask structure 214 is formed over the insulating structure 212. The mask structure 214 fills in a recess defined by the vertically extending portion 210b of the barrier layer 210 and the top surface of the insulating structure 212. This step (i.e., the step S216) is similar to the step S116 as described with reference to FIG. 2H.

Figure 4I:
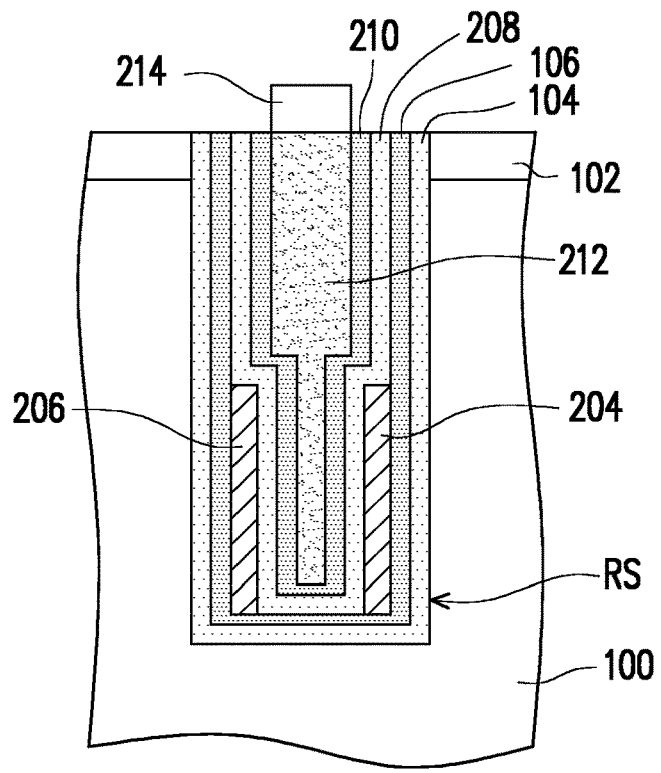

Referring to FIG. 4I, step S218 is performed, and portions of the channel layer 104, the barrier layer 106, the channel layer 208 and the barrier layer 210 above the hard mask pattern 102 are removed. As such, top surfaces of the hard mask pattern 102, the channel layer 104, the barrier layer 106, the channel layer 208 and the barrier layer 210 may be substantially coplanar with one another.

Figure 4J:
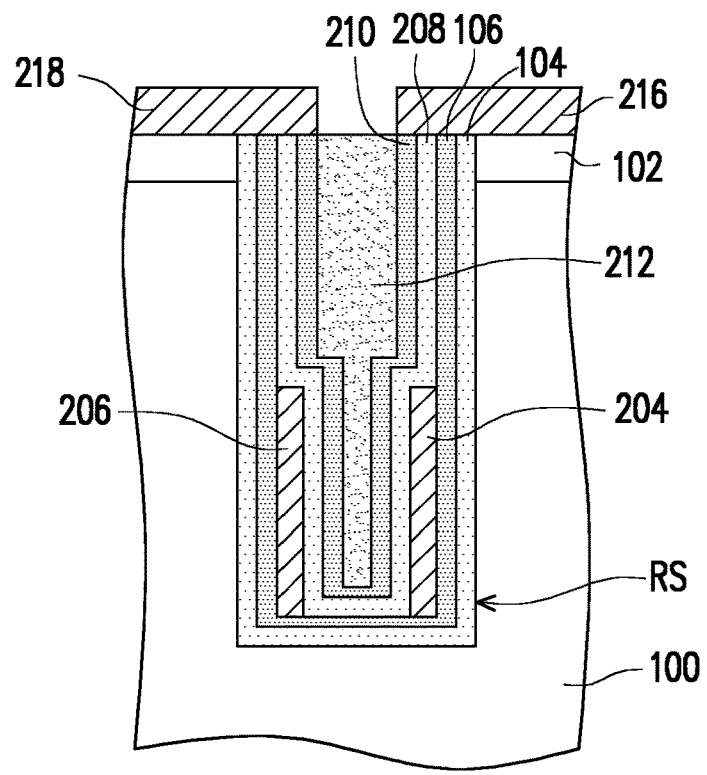

Referring to FIG. 4J, step S220 is performed, and a drain electrode 216 and a source electrode 218 are formed at opposite sides of the mask structure 214. The drain electrode 216 and the source electrode 218 are separated from each other, and cover portions of the barrier layer 210, the channel layer 208, the barrier layer 106, the channel layer 104 and the hard mask pattern 102 located at opposite sides of the mask structure 214. A material, a thickness and a formation method of the drain electrode 216 and the source electrode 218 are similar to those of the drain electrode 116 and the source electrode 118 as described with reference to FIG. 2J, and would not be repeated again.

Thereafter, step S222 is performed, and the mask structure 214 is removed. Once the mask structure 214 has been removed, the top surface of the insulating structure 212 and opposing sidewalls of the drain electrode 216 and the source electrode 218 may be exposed.

Figure 4K:
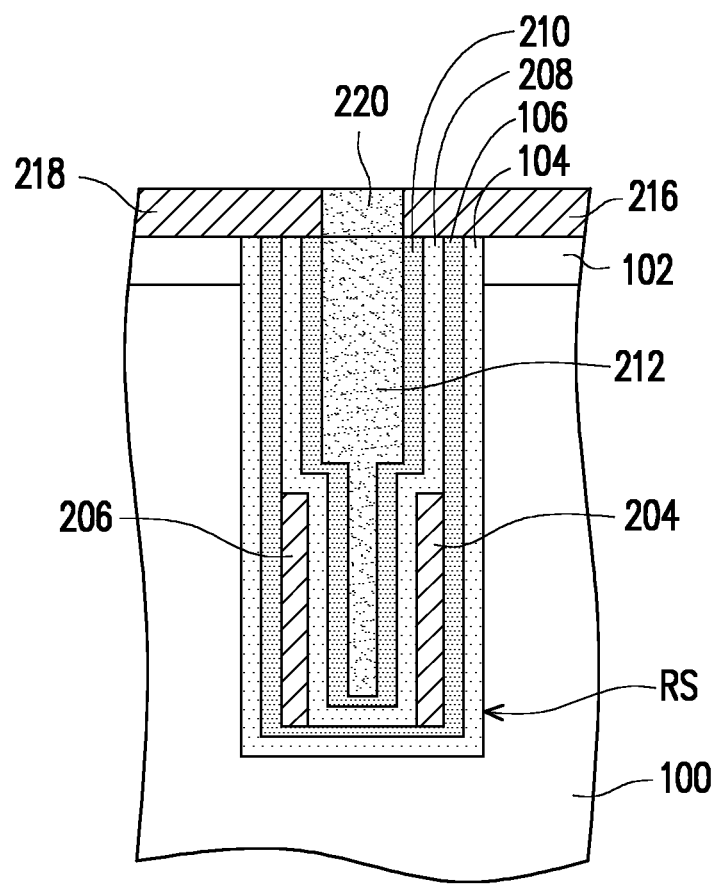

Referring to FIG. 4K, step S224 is performed, and another insulating structure 220 is formed over the insulating structure 212. The insulating structure 220 fills in a recess defined by the top surface of the insulating structure 212 and the sidewalls of the drain electrode 216 and the source electrode 218.

Up to here, manufacturing of a semiconductor device 20 according to some embodiments of the present disclosure may have been completed. The semiconductor device 20 includes the hetero junction formed by the channel layer 104 and the barrier layer 106, and further includes the hetero junction formed by the channel layer 208 and the barrier layer 210. The first gate electrode 204 and the second gate electrode 206 are separately located between these two hetero junctions, and may be configured to receive voltages for controlling the 2DEG/2DHG formed in these two hetero junctions.

Figure 5:
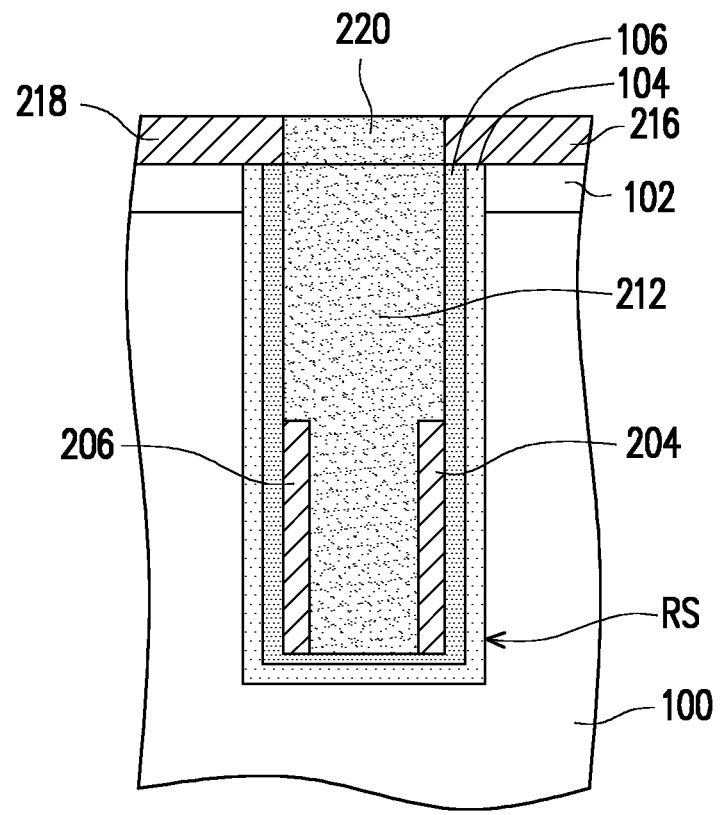
FIG. 5 is a schematic cross-sectional view illustrating a semiconductor device according to some embodiments of the present disclosure.

Referring to FIG. 4K and FIG. 5, a semiconductor device 30 as shown in FIG. 5 is similar to the semiconductor device 20 as shown in FIG. 4K, except that the channel layer 208 and the barrier 210 as shown in FIG. 4K are omitted from the semiconductor device 30 as shown in FIG. 5. As shown in FIG. 5, the insulating structure 212 may be in contact with the barrier layer 106, the first gate electrode 204 and the second gate electrode 206. The insulating structure 220 is located over the insulating structure 212, and may be in contact with the barrier layer 106 and sidewalls of the drain electrode 216 and the source electrode 218.

As above, the semiconductor device according to embodiments of the present disclosure is an embedded type semiconductor device. A conductive channel of the semiconductor device (i.e., the 2DEG/2DHG as described above) is formed inside the recess of the substrate, rather than being formed in a portion of the substrate close to the recess of the substrate. In this way, charges in the conductive channel can be avoided from moving to the drain electrode or the source electrode on the substrate through a path in the substrate, thus formation of sneak current can be avoided. Therefore, reliability of the semiconductor device can be improved. In addition, charges can be avoided from moving between the semiconductor device and adjacent devices along paths in the substrate. As such, interference between the semiconductor device and other devices can be reduced. In some embodiments, the semiconductor device includes the hard mask pattern. The hard mask pattern is disposed between the drain electrode and the substrate, and between the source electrode and the substrate. Charges can be further blocked by the hard mask pattern from moving to the drain electrode and the source electrode from the substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a semiconductor device, comprising:
   forming a recess at a top surface of a substrate;
   forming a channel layer and a barrier layer in order, to conformally cover surfaces of the recess, wherein a hetero junction formed at an interface of the channel layer and the barrier layer is external to the substrate, and a two dimensional electron gas or a two dimensional hole gas is induced along the hetero junction external to the substrate;
   filling up the recess with a conductive material;
   removing a top portion of the conductive material, such that a lower portion of the conductive material remained in the recess forms a gate electrode; and
   forming an insulating structure on the gate electrode.

2. The manufacturing method of the semiconductor device according to claim 1, further comprising:
   forming a hard mask layer on the top surface of the substrate before formation of the recess.

3. The manufacturing method of the semiconductor device according to claim 2, wherein an opening is formed through the hard mask layer during formation of the recess.

4. The manufacturing method of the semiconductor device according to claim 1, further comprising:
   thinning a horizontally extending portion of the barrier layer before formation of the conductive material.

5. The manufacturing method of the semiconductor device according to claim 1, further comprising:
   forming a drain electrode and a source electrode over the top surface of the substrate and covering topmost surfaces of the channel layer and the barrier layer, wherein the drain electrode and the source electrode are located at opposite sides of the gate electrode.

6. The manufacturing method of the semiconductor device according to claim 5, wherein a method for forming the drain electrode and the source electrode comprises:
   forming a mask structure on the insulating structure;
   forming a conductive material layer lying over the top surface of the substrate and covering the mask structure;
   removing a portion of the conductive material layer above the mask structure, such that portions of the conductive material layer remained at opposite sides of the mask structure form the drain electrode and the source electrode; and
   removing the mask structure.

7. The manufacturing method of the semiconductor device according to claim 6, wherein the channel layer and the barrier layer initially extend along the surfaces of the recess and the top surface of the substrate, and the manufacturing method of the semiconductor device further comprises removing portions of the channel layer and the barrier layer extending along the top surface of the substrate after formation of the mask structure and before formation of the conductive material layer.

8. The manufacturing method of the semiconductor device according to claim 6, further comprising:
   forming an additional insulating structure between the source and drain electrodes after removal of the mask structure.

9. A manufacturing method of a semiconductor device, comprising:
   forming a recess at a top surface of a substrate;
   forming a first channel layer and a first barrier layer in order, to conformally cover surfaces of the recess;
   forming a first dummy structure and a second dummy structure in the recess, wherein the first and second dummy structures are in lateral contact with vertically extending portions of the first barrier layer, and are laterally spaced apart from each other;
   forming a mask structure between the first and second dummy structures;
   removing the first and second dummy structures to form first and second gaps between the mask structure and the vertically extending portions of the first barrier layer;
   forming a first gate electrode and a second gate electrode in the first and second gaps, respectively;
   removing the mask structure; and
   filling an insulating structure in the recess.

10. The manufacturing method of the semiconductor device according to claim 9, further comprising:
    forming a hard mask layer on the top surface of the substrate before formation of the recess.

11. The manufacturing method of the semiconductor device according to claim 10, wherein an opening is formed through the hard mask layer during formation of the recess.

12. The manufacturing method of the semiconductor device according to claim 9, further comprising:
thinning a horizontally extending portion of the first barrier layer before formation of the first and second dummy structures.

13. The manufacturing method of the semiconductor device according to claim 9, wherein a method for forming the first and second gate electrodes comprises:
filling a conductive material in the first and second gaps; and
recessing the conductive material, wherein a portion of the conductive material remained in the first gap forms the first gate electrode, and a portion of the conductive material remained in the second gap forms the second gate electrode.

14. The manufacturing method of the semiconductor device according to claim 9, further comprising:
sequentially forming a second channel layer and a second barrier layer in the recess after removal of the mask structure and before filling the insulating structure in the recess, wherein the second channel layer conformally extends along surfaces of the first barrier layer, the first gate electrode and the second electrode, and the second barrier layer conformally covers the second channel layer.

15. The manufacturing method of the semiconductor device according to claim 14, further comprising:
thinning a horizontally extending portion of the second barrier layer before filling the insulating structure in the recess.

16. The manufacturing method of the semiconductor device according to claim 14, further comprising:
forming a drain electrode and a source electrode over the top surface of the substrate and covering topmost surfaces of the first channel layer, the first barrier layer, the second channel layer and the second barrier layer, wherein the drain electrode and the source electrode are located at opposite sides of the insulating structure.

17. The manufacturing method of the semiconductor device according to claim 16, wherein a method for forming the drain electrode and the source electrode comprises:
forming an additional mask structure on the insulating structure;
forming a conductive material layer lying over the top surface of the substrate and covering the additional mask structure;
removing a portion of the conductive material layer above the additional mask structure, such that portions of the conductive material layer remained at opposite sides of the additional mask structure form the drain electrode and the source electrode; and
removing the additional mask structure.

18. The manufacturing method of the semiconductor device according to claim 17, wherein the first channel layer, the first barrier layer, the second channel layer and the second barrier layer initially extend along the surfaces of the recess and the top surface of the substrate, and the manufacturing method of the semiconductor device further comprises removing portions of the first channel layer, the first barrier layer, the second channel layer and the second barrier layer extending along the top surface of the substrate after formation of the additional mask structure and before formation of the conductive material layer.

19. The manufacturing method of the semiconductor device according to claim 17, further comprising:
forming an additional insulating structure between the source and drain electrodes after removal of the additional mask structure.

20. The manufacturing method of the semiconductor device according to claim 9, further comprising:
forming an additional mask structure on the insulating structure;
forming a conductive material layer lying over the top surface of the substrate and covering the additional mask structure;
removing a portion of the conductive material layer above the additional mask structure, such that portions of the conductive material layer remained at opposite sides of the additional mask structure form a drain electrode and a source electrode over the top surface of the substrate and covering topmost surfaces of the first channel layer and the first barrier layer; and
removing the additional mask structure.

* * * * *